(12) United States Patent
Meli Thompson et al.

(10) Patent No.: US 10,539,884 B2
(45) Date of Patent: Jan. 21, 2020

(54) POST-LITHOGRAPHY DEFECT INSPECTION USING AN E-BEAM INSPECTION TOOL

(71) Applicant: International Business Machines Corporation, Armonk, NY (US)

(72) Inventors: Luciana Meli Thompson, Albany, NY (US); Ashim Dutta, Menands, NY (US); Ekmini A. De Silva, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 79 days.

(21) Appl. No.: 15/902,036

(22) Filed: Feb. 22, 2018

(65) Prior Publication Data

US 2019/0258171 A1 Aug. 22, 2019

(51) Int. Cl.
*G01R 31/26* (2014.01)
*G03F 7/20* (2006.01)
(Continued)

(52) U.S. Cl.
CPC ............ *G03F 7/7065* (2013.01); *C23C 16/24* (2013.01); *C23C 16/40* (2013.01); *C23C 16/45525* (2013.01); *C23C 16/45536* (2013.01); *G03F 7/167* (2013.01); *H01L 21/0228* (2013.01); *H01L 21/0273* (2013.01); *H01L 21/02274* (2013.01); *H01L 22/12* (2013.01); *H01J 37/28* (2013.01); *H01L 21/0214* (2013.01); *H01L 21/0217* (2013.01); *H01L 21/02126* (2013.01); *H01L 21/02164* (2013.01); *H01L 21/02167* (2013.01); *H01L 21/02175* (2013.01);
(Continued)

(58) Field of Classification Search
CPC .............................. G03F 7/7065; C23C 16/24
USPC ........................................................... 438/14
See application file for complete search history.

(56) References Cited

U.S. PATENT DOCUMENTS

| | | | |
|---|---|---|---|
| 5,783,366 A | 6/1998 | Chen et al. | |
| 6,352,803 B1 | 3/2002 | Tong et al. | |

(Continued)

FOREIGN PATENT DOCUMENTS

| | | |
|---|---|---|
| JP | 61125034 A | 6/1986 |
| JP | 2010129755 A | 6/2010 |
| KR | 1020030058669 A | 7/2003 |

OTHER PUBLICATIONS

Cheng—et al.,"Enhance Extreme UltraViolet Lithography mask inspection contrast by using Fabry-Perot type antireflective coatings," Digest of Papers Microprocesses and Nanotechnology 2003; pp. 94-95.

*Primary Examiner* — Caleb E Henry
(74) *Attorney, Agent, or Firm* — Cantor Colburn LLP; Vazken Alexanian

(57) ABSTRACT

Methods for post-lithographic inspection using an e-beam inspection tool of organic EUV sensitive photoresists generally includes conformal deposition of a silicon derivative or a metal oxide onto the relief image, wherein the silicon derivative is a material selected to have a dielectric constant that is greater than the dielectric constant of the underlying organic EUV sensitive photoresist. The conformal deposition of the silicon derivative or the metal oxide includes a low temperature vapor deposition process of less than about 100° C. to provide a coating thickness of less than about 5 nanometers.

20 Claims, 1 Drawing Sheet

UNCOATED

COATED

(51) Int. Cl.
  *G03F 7/16* (2006.01)
  *C23C 16/455* (2006.01)
  *C23C 16/24* (2006.01)
  *C23C 16/40* (2006.01)
  *H01L 21/027* (2006.01)
  *H01L 21/02* (2006.01)
  *H01L 21/66* (2006.01)
  *H01J 37/28* (2006.01)

(52) U.S. Cl.
  CPC .. *H01L 21/02181* (2013.01); *H01L 21/02183* (2013.01); *H01L 21/02186* (2013.01)

(56) References Cited

U.S. PATENT DOCUMENTS

| | | |
|---|---|---|
| 6,440,621 B1 | 8/2002 | Sutton et al. |
| 6,486,946 B1 | 11/2002 | Stover et al. |
| 6,596,553 B1 | 7/2003 | Lin et al. |
| 9,496,119 B1 | 11/2016 | De et al. |
| 2005/0008944 A1* | 1/2005 | Cerrina ............... B82Y 10/00 430/5 |
| 2007/0099431 A1* | 5/2007 | Li ....................... H01L 21/3081 438/735 |
| 2008/0311283 A1 | 12/2008 | Brasack et al. |
| 2011/0181868 A1* | 7/2011 | Stokowski ........... B82Y 10/00 356/51 |
| 2014/0091476 A1* | 4/2014 | Nyhus ................. H01L 23/5226 257/774 |
| 2014/0273476 A1* | 9/2014 | Cheng ................. B81C 1/00031 438/703 |

\* cited by examiner

UNCOATED　　　　　COATED

US 10,539,884 B2

POST-LITHOGRAPHY DEFECT INSPECTION USING AN E-BEAM INSPECTION TOOL

BACKGROUND

The present invention generally relates to post-lithography defect inspection using an e-beam inspection tool.

Lithography is utilized for the fabrication of semiconductor structures, such as integrated circuits and micromechanical structures. The basic process of producing a semiconductor structures involves the modification of the surface material of a semiconductor substrate, such as of silicon, in a pattern. The interplay of the material changes and the pattern defines the electrical characteristics of the microelectronic device. A similar process can be used to form micromechanical devices, by, for example, electroplating metal structures in a desired pattern onto a substrate. Lithography is used to define the pattern on the substrate, which will be doped, etched, or otherwise modified to form the microelectrical or micromechanical device.

In a basic lithography process for the fabrication of semiconductor structures, a photoresist is deposited on a substrate surface. The photoresist is sensitive to radiation, e.g., extreme ultraviolet (EUV) radiation, and, depending on the photoresist used, portions of the photoresist that are exposed to the radiation can be removed (or left remaining) by a development process. The semiconductor structure is formed by etching or otherwise modifying the substrate in the areas from which the photoresist has been removed. To form a desired pattern in the photoresist, the radiation that is used to expose the photoresist is passed through or reflected off of a lithography mask that defines the pattern that is to be transferred to the photoresist.

SUMMARY

Embodiments of the present invention are generally directed to methods for preparing a semiconductor wafer with organic extreme ultraviolet (EUV) sensitive photoresist relief images thereon for defect inspection, methods for examining a semiconductor wafer having an organic EUV photoresist relief image thereon using an e-beam inspection tool, and methods for examining a semiconductor wafer having an organic EUV photoresist relief image thereon for defects.

A non-limiting example method for preparing a semiconductor wafer with an organic EUV photoresist relief image thereon for defect inspection according to embodiments of the invention includes providing a semiconductor wafer having a relief image of an organic EUV sensitive photoresist thereon. A silicon derivative or a metal oxide is conformally coated onto the relief image using a vapor deposition process at a temperature of less than about 100° C. and at a thickness less than about 5 nanometers, wherein the silicon derivative has a dielectric constant greater than the organic EUV photoresist. The wafer can be inspected using an e-beam inspection tool.

A non-limiting example method for examining a semiconductor wafer having an organic EUV photoresist relief image thereon using an e-beam inspection tool according to embodiments of the invention includes providing a semiconductor wafer having an organic EUV photoresist relief image thereon. A silicon derivative or a metal oxide is conformally coated onto the photoresist relief image using a vapor deposition process at a temperature less than about 100° C. and at a thickness less than about 5 nanometers, wherein the silicon derivative has a dielectric constant greater than the organic EUV photoresist. The wafer can be introduced into an e-beam inspection tool configured to scan the wafer for defect detection.

A non-limiting example method for examining a semiconductor wafer having an organic EUV photoresist relief image thereon using an e-beam inspection tool according to embodiments of the invention includes coating an organic EUV photoresist onto a semiconductor wafer at a thickness within a range of about 30 nanometers to about 50 nanometers. A relief image of the EUV photoresist is lithographically formed, wherein the relief image includes sub-40 nm lines and spaces having a pitch of about 1:1 or less. A silicon derivative or a metal oxide is conformally coated onto the relief image using a vapor deposition at a temperature less than about 100° C. and at a thickness less than about 5 nanometers, wherein the silicon derivative has a dielectric constant greater than the organic EUV photoresist. The wafer can be introduced in an e-beam tool for inspection, and the semiconductor wafer is inspected. Inspecting the semiconductor wafer includes taking an image at a location on the semiconductor wafer by scanning the semiconductor wafer with a focused electron beam and comparing the image at the location to a reference image from another wafer location with an identical design or to a preexisting image in order to flag differences between the image at the location and the reference image or the preexisting image as a defect.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
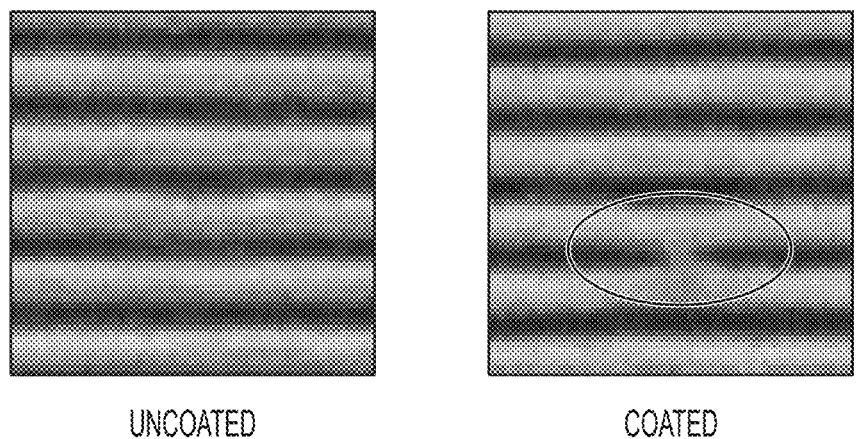
FIG. 1 are scanning electron micrographs comparing coated and uncoated relief images formed from an organic EUV photoresist in accordance with embodiments of the invention.

The present invention generally relates to post-EUV lithography defect inspection, i.e., after development inspection of a patterned organic EUV photoresist. The post-EUV lithography defect inspection process generally includes conformally coating the patterned EUV photoresist with a thin layer of a silicon derivative or a metal oxide prior to defect inspection with an ebeam inspection tool. The silicon derivative is selected to have a dielectric constant value greater than a dielectric constant of the EUV photoresist used to form the pattern. The metal oxide is not intended to be limited and can include oxides of titanium, hafnium, tantalum, cobalt, tungsten or the like. The silicon derivative or the metal oxide is deposited at a thickness of less than 5 nanometers (nm). The silicon derivative and the metal oxide can be deposited by a low temperature and conformal vapor deposition process. Advantageously, scanning electron microscope (SEM) images can be obtained that provide detection of microbridges and scumming within the patterned organic EUV photoresist, which were not readily discernable using prior processes at smaller features sizes.

Scanning electron microscopy has become a valuable tool for examining and measuring patterns in the sub-micron range. SEMs are used gather images of specimens at high magnifications. The beam rasters across a certain area and captures an image. A specific type of SEM, known as a high resolution scanning electron microscopes gather images at very high resolution and low beam current and used to measure dimensions of features on the image.

Another type of charged particle tool, known as an e-beam defect inspection tool, is used for localizing "defects," i.e., local abnormalities on the surface of semiconductor wafer used for fabricating integrated circuits. E-beam defect inspection tools are used in two modes. In a first mode, known as physical defect inspection, the electron beam gathers images of large enough areas to be able to capture a physical defect or abnormality of interest i.e. the defect physically appears in the area being imaged and is visible in the image created in the detector. Note that the defect need not be "clearly" visible for the inspection tool to operate. It must only generate a signal strong enough to suggest that a defect exists. Once the inspector has localized the defect, the localized defect is typically used to gather higher resolution images in a review scanning electron microscope. The review scanning electron microscope can then be used to obtain images at these specific local defect locations for the purposes of taking high-resolution images of the defect which can further include comparing the image to a reference image from another wafer location with an identical design, or to a preexisting image stored on a computer, so as to flag differences between the image of the location and the reference image or the preexisting image as a defect.

The thickness of these coatings were typically about 10 nm and have a grain size of about 2 to 5 nm. However, as feature sizes scale downward, the prior art of sputtering post-lithographic sub-36 nm line-space patterns, for example, with these types of conductive metals followed by SEM inspection failed to detect the presence of microbridges or scumming, which were evident from inspection of the post-etched patterned substrates. For photoresist scumming, the typical defect detection size is about 5 to 10 nm, which is smaller than the grain size the conductive metals used in the prior art. The present invention overcomes these problems by conformally depositing the silicon derivative or the metal oxide to a thickness less than 5 nm onto the specimen just prior to insertion into the microscope. In the case of the silicon dielectric derivative coating, the silicon derivative is selected to have a higher dielectric constant than the underlying organic EUV photoresist. For example, the dielectric constant k value for a polystyrene-based organic EUV polymer commonly used in organic EUV photoresists is about 2.5 whereas the k value for silicon derivatives is markedly higher at about 2.5 to as high as about 7.5. This provides an increase in thermal conductivity relative to the uncoated photoresist, allowing a discharge path to ground without disturbing the features being observed.

Detailed embodiments of the processes of the present invention for post-lithography defect inspection will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

In one or more embodiments, the post-EUV lithography inspection process generally includes exposing an organic EUV photoresist layer through a mask with EUV radiation to form a latent image; developing the latent image in the photoresist layer to form a pattern in the photoresist, conformally coating the patterned photoresist with a silicon derivative or metal oxide at a thickness less than 5 nm; and inspecting the patterned photoresist by e-beam inspection. The e-beam inspection can include scanning areas of the wafer where the defect might be located, and comparing the image formed to reference images. The reference images are obtained from another part of the wafer with the same design of from stored images. Differences between the images will be flagged as a defect. The inspection will thus identify residues, debris, and scum left by photoresist lithographic processing. In one or more embodiments of the invention, the thickness of the conformal coating of the silicon derivative or the metal oxide is within a range of about 1 nm to about 3 nm.

The silicon derivative is not intended to be limited. In one or more embodiments of the invention, the silicon derivative is elected from the group consisting of silicon dioxide, silicon nitride, silicon oxynitride, silicon carbide, silicon oxycarbide and the like.

The metal oxide is not intend to be limited. In one or more embodiments of the invention, the metal oxide is an oxide selected from the group of metals including titanium, hafnium, tantalum, cobalt, tungsten, combinations thereof, and the like.

Table 1 below provides a comparison of various properties of gold sputtered coated films to silicon derivative coated films. As shown, the silicon derivative can be selected to have a greater dielectric constant than the exemplary polystyrene photoresist as well as provide a higher thermal conductivity, which when exposed to the low temperature vapor deposition process has been found not to affect the underlying photoresist profile, not to induce defects, and advantageously mitigate accumulation of charge on the photoresist.

TABLE 1

| | Gold Sputtering | Silicon derivative | Polystyrene-based EUV photoresist |
|---|---|---|---|
| Dielectric Constant | Conductor | 2.5-7.5 | 2.5 |
| Thermal Conductivity (W/m K) | 310 | 1.1 | 0.04 |
| Thickness (nm) | 5-10 | 1-5 | NA |
| Grain Size | 2-5 nm | Amorphous | NA |

In operation, an organic EUV photosensitive resist layer is deposited onto a substrate, patterned and developed to form a relief image. The EUV photosensitive resist layer is not intended to be limited and can be a chemically amplified photoresist or a non-chemically amplified photoresist as is known in art. The thickness of the EUV photosensitive layer will generally depend on the properties thereof and generally ranges from about 30 nm to about 50 nm. By way of example, the organic EUV photoresist can include polystyrenes, polyacrylates, derivatives thereof, copolymers thereof, terpolymers thereof, and the like.

Once the organic EUV photoresist is lithographically patterned, a thin conformal coating of the silicon derivative or the metal oxide is deposited using a low temperature vapor deposition process, wherein the deposition temperature is less than 100° C. The vapor phase deposition process is not intended to be limited to any particular method. In embodiments of the invention, the vapor phase deposition process can be an atomic layer deposition process ("the ALD process").

The ALD process generally refers to a process for producing thin films over a substrate molecular layer by molecular layer using self-saturating and self-limiting chemical reactions. Suitable ALD processes include, without limitation, both thermal ALD and plasma-enhanced ALD (PEALD) processes. In a typical ALD process, precursors, also called gaseous reactants, are conducted into a reaction space in a reactor where they contact a photoresist and react with the photoresist surface in a self-limiting manner. The pressure and the temperature of the reaction chamber are adjusted to a range where physisorption (i.e. condensation of gases) and thermal decomposition of the precursors are avoided. Because of steric hindrance, only up to one monolayer (i.e., an atomic layer or a molecular layer) of material is deposited at a time during each pulsing cycle. Thus, the actual growth rate of the thin film, which is typically presented as Å/pulsing cycle, depends, for example, on the number of available reactive surface sites or active sites on the surface and bulkiness of the chemisorbing molecules. Gas phase reactions between the precursors and any undesired reactions of byproducts are inhibited because precursor pulses are separated from each other by time and the reaction chamber is purged with an inactive or inert gas (e.g. nitrogen, argon or hydrogen) and/or evacuated using, e.g., a pumping system between precursor pulses to remove surplus gaseous reactants and reaction byproducts from the chamber. For the plasma enhanced atomic layer deposition of the silicon derivative or the metal oxide, the RF power is typically greater than about 0 to about 50 Watts (W) and RF time is from about 0 to about 1 second.

In aspects of the present invention, the precursors for forming the silicon derivative or the metal oxide is introduced in the vapor phase into the reaction space of the reactor. The precursor reacts with reactive sites present on the surface of the photoresist. Because of steric hindrance, a monolayer of the reacted precursor is formed. The process can be repeated to provide additional monolayers up to a thickness of less than about 5 nm. As noted above, with regard to the silicon derivative, the dielectric constant is selected to be greater than the dielectric constant of the organic photoresist being inspected. The metal oxide can be deposited using a low temperature deposition process such as thermal or plasma enhanced atomic layer deposition at temperatures in a range from about room temperature (e.g., about 20° C.) to less than about 100° C. so as to provide an amorphous conformal coating.

Figure 2:
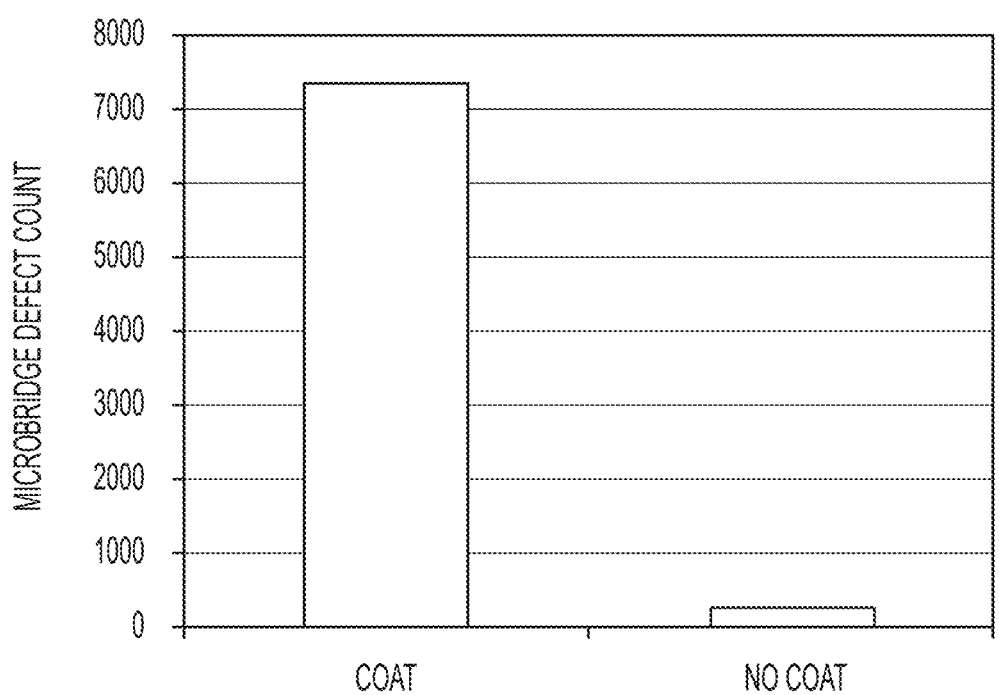
FIG. 2 graphically illustrates microbridge defects observed as a function of coated and uncoated relief images formed from an organic EUV photoresist in accordance with embodiments of the invention.

Turning now to the FIGS. 1-2, there are shown comparisons between coated and uncoated organic EUV photoresist relief images. In FIG. 1, there are shown SEM images of uncoated and coated organic EUV photoresist. An oxide was deposited onto the EUV photoresist using a thermal ALD process to at a thickness of about 3 nm.

In FIG. 2, there is graphically shown the microbridge defect count of a relief image formed from organic EUV photoresist as a function of coated and uncoated EUV photoresist. Clearly, as shown, the coated relief images provide much greater sensitivity for microbridge defect detection due to mitigation of charging and decoration of the defect leading to an effective increase in size.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A method for preparing a semiconductor wafer with organic extreme ultraviolet sensitive (EUV) photoresist relief images thereon for defect inspection, the method comprising:
   providing a semiconductor wafer having a relief image of an organic EUV sensitive photoresist thereon;
   conformally coating a silicon derivative or a metal oxide onto the relief image using a vapor deposition process at a temperature less than about 100° C. and at a thickness less than about 5 nanometers, wherein a dielectric constant of the silicon derivative is greater than a dielectric constant of the organic EUV photoresist; and
   inspecting the wafer using an e-beam inspection tool.

2. The method of claim 1, wherein the vapor deposition process comprises a thermal atomic layer deposition process.

3. The method of claim 1, wherein the vapor deposition process comprises a plasma enhanced atomic layer deposition process.

4. The method of claim 1 wherein the silicon derivative has a dielectric constant greater than about 2.5 and the organic EUV photoresist has a dielectric constant less than about 2.5.

5. The method of claim 1 wherein the silicon derivative has a dielectric constant greater than about 2.5 and less than about 7.5.

6. The method of claim 1 wherein the silicon derivative comprises a material selected from the group consisting of silicon dioxide, silicon nitride, silicon oxynitride, silicon carbide and silicon oxycarbide.

7. The method of claim 1, wherein the metal oxide comprises an oxide of a metal selected from the group consisting of titanium, hafnium, tantalum, cobalt, and tantalum.

8. The method of claim 1, wherein the vapor deposition process is at temperature ranging from about room temperature to less than about 100° C.

9. The method of claim 1, wherein the silicon derivative coating is amorphous.

10. A method for examining a semiconductor wafer having an organic EUV photoresist relief image thereon using an e-beam inspection tool, the method comprising:
    providing a semiconductor wafer having an organic EUV photoresist relief image thereon;
    conformally coating a silicon derivative or a metal oxide onto the photoresist relief image using a vapor deposition process at a temperature less than about 100° C. and at a thickness less than about 5 nanometers, wherein a dielectric constant of the silicon derivative is greater than a dielectric constant of the organic EUV photoresist; and
    introducing the wafer into an e-beam inspection tool and scanning the wafer for defect detection.

11. The method of claim 10, wherein the vapor deposition process comprises a thermal atomic layer deposition process.

12. The method of claim 10, wherein the vapor deposition process comprises a plasma enhanced atomic layer deposition process.

13. The method of claim 10, wherein the silicon derivative has a dielectric constant greater than about 2.5 and the organic EUV photoresist has a dielectric constant less than about 2.5.

14. The method of claim 10, wherein the silicon derivative has a dielectric constant greater than about 2.5 to less than about 7.5.

15. The method of claim 10, wherein the silicon derivative comprises a material selected from the group consisting of silicon dioxide, silicon nitride, silicon oxynitride, silicon carbide and silicon oxycarbide.

16. The method of claim 10, wherein the metal oxide comprises an oxide of a metal selected from the group consisting of titanium, hafnium, tantalum, cobalt, and tantalum.

17. The method of claim 10, wherein the vapor deposition process is at temperature ranging from about room temperature to less than about 100° C.

18. The method of claim 10, wherein examining the wafer comprises measuring dimensions of patterns in the photoresist relief image and identifying residues, debris, and scum left by photoresist processing.

19. A method for examining a semiconductor wafer having an organic EUV photoresist relief image thereon for defects, the method comprising:

coating an organic EUV photoresist onto a semiconductor wafer at a thickness within a range of about 30 nanometers to about 50 nanometers;

lithographically forming a relief image of the EUV photoresist, wherein the relief image comprises sub-40 nm lines and spaces having a pitch of about 1:1 or less;

conformally coating a silicon derivative or a metal oxide onto the relief image using a vapor deposition at a temperature less than about 100° C. and at a thickness less than about 5 nanometers, wherein a dielectric constant of the silicon derivative is greater than a dielectric constant of the organic EUV photoresist; and introducing the wafer in an e-beam tool for inspection and inspecting the semiconductor wafer, wherein inspecting the semiconductor wafer comprises taking an image of a location by scanning the semiconductor wafer with a focused electron beam and comparing the image to a reference image from another wafer location with an identical design, or to a preexisting image stored on a computer, so as to flag differences between the image of the location and the reference image or the preexisting image as a defect.

20. The method of claim 19, wherein the vapor deposition process is a thermal atomic layer deposition process or a plasma enhanced atomic layer deposition process.

* * * * *